(12) United States Patent
Sekiya

(10) Patent No.: US 8,956,956 B2
(45) Date of Patent: Feb. 17, 2015

(54) WAFER PROCESSING METHOD

(71) Applicant: Disco Corporation, Tokyo (JP)

(72) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/056,524

(22) Filed: Oct. 17, 2013

(65) Prior Publication Data

US 2014/0127882 A1     May 8, 2014

(30) Foreign Application Priority Data

Nov. 5, 2012   (JP) .................................. 2012-243520

(51) Int. Cl.
   *H01L 21/78* (2006.01)
(52) U.S. Cl.
   CPC ....................................... *H01L 21/78* (2013.01)
   USPC ............................ 438/462; 438/464; 438/465
(58) Field of Classification Search
   CPC ... B23K 26/4075; H01L 23/544; H01L 21/78
   USPC ................................................ 438/462, 463
   See application file for complete search history.

(56) References Cited

U.S. PATENT DOCUMENTS

| | | | |
|---|---|---|---|
| 6,371,840 B1 * | 4/2002 | Ball et al. ....................... | 451/364 |
| 2008/0185286 A1 * | 8/2008 | Lehmann ................. | 204/192.34 |
| 2008/0214094 A1 * | 9/2008 | Katoh et al. .................... | 451/41 |
| 2008/0251188 A1 * | 10/2008 | Sekiya .......................... | 156/153 |
| 2009/0047881 A1 * | 2/2009 | Satitpunwaycha et al. ... | 451/291 |
| 2009/0098710 A1 | 4/2009 | Yamazaki | |
| 2010/0311225 A1 | 12/2010 | Sekiya | |

FOREIGN PATENT DOCUMENTS

| | | |
|---|---|---|
| JP | 11-026402 | 1/1999 |
| JP | 2005-153090 | 6/2005 |

* cited by examiner

*Primary Examiner* — Olik Chaudhuri
*Assistant Examiner* — Christine Enad
(74) *Attorney, Agent, or Firm* — Greer Burns & Crain Ltd.

(57) ABSTRACT

A wafer processing method includes: a protective member providing step of providing a protective member on the front side of a wafer; a wafer quarter generating step of cutting the wafer along the division line extending in a first direction through the center of the wafer and along the division line extending in a second direction perpendicular to the first direction through the center of the wafer, thereby generating four sectorial wafer quarters; a back grinding step of grinding the back side of each wafer quarter to reduce the thickness of the wafer quarter; a frame providing step of supporting the wafer quarter through an adhesive tape to an annular frame; and a wafer quarter dividing step of fully cutting the wafer quarter along all of the division lines extending in the first and second directions, thereby dividing the wafer quarter into the individual devices.

1 Claim, 10 Drawing Sheets

WAFER PROCESSING METHOD

BACKGROUND OF THE INVENTION

1. Field of the Invention

The present invention relates to a wafer processing method which can process a large-diameter wafer by using existing equipment to the maximum.

2. Description of the Related Art

A plurality of crossing division lines are formed on the front side of a semiconductor wafer (which will be hereinafter referred to also simply as wafer) to thereby partition a plurality of regions where a plurality of devices such as ICs and LSIs are respectively formed. The back side of the wafer is ground to reduce the thickness of the wafer to a desired thickness. Thereafter, the wafer is divided along the division lines to obtain the individual devices, which are widely used in various electrical equipment such as mobile phones and personal computers.

In dividing the semiconductor wafer, a cutting apparatus called a dicing apparatus is widely used. The dicing apparatus includes a chuck table for holding the wafer and cutting means for rotatably supporting a cutting blade. The wafer is supported through a dicing tape to an annular frame prior to holding the wafer on the chuck table. To improve the productivity, the diameter of the wafer tends to be increased as to 200 mm, 300 mm, and 450 mm. Accordingly, it is essential to develop a processing apparatus such as a dicing apparatus and a grinding apparatus conforming to such a large-diameter wafer.

SUMMARY OF THE INVENTION

However, in the case of processing a wafer having a diameter of 450 mm, a new system must be constructed by using a processing apparatus conforming to a 450 mm wafer in spite of the fact that there has already been provided equipment for grinding the back side of a 300-mm wafer to divide the wafer into individual devices. As a result, equipment costs become very high to cause a squeeze on profits.

It is therefore an object of the present invention to provide a wafer processing method which can use existing equipment even in the case of a large-diameter wafer.

In accordance with an aspect of the present invention, there is provided a wafer processing method for dividing a wafer into a plurality of individual devices along a plurality of division lines extending in a first direction on the front side of the wafer and a plurality of division lines extending in a second direction perpendicular to the first direction on the front side of the wafer, the individual devices being respectively formed in a plurality of regions partitioned by the division lines extending in the first direction and the division lines extending in the second direction, the wafer processing method including a protective member providing step of providing a protective member on the front side of the wafer; a wafer quarter generating step of cutting the wafer along the division line extending in the first direction through the center of the wafer and along the division line extending in the second direction through the center of the wafer after performing the protective member providing step, thereby generating four sectorial wafer quarters; a back grinding step of grinding the back side of each wafer quarter to reduce the thickness of the wafer quarter after performing the wafer quarter generating step; a frame providing step of preparing an annular frame having an opening capable of accommodating the wafer quarter after performing the back grinding step, next placing the wafer quarter in the opening of the annular frame, next attaching an adhesive tape to the annular frame and the back side of the wafer quarter, and next peeling the protective member from the front side of the wafer quarter, thereby supporting the wafer quarter through the adhesive tape to the annular frame; and a wafer quarter dividing step of fully cutting the wafer quarter along all of the division lines extending in the first direction and along all of the division lines extending in the second direction after performing the frame providing step, thereby dividing the wafer quarter into the individual devices.

According to the wafer processing method of the present invention, at least one cutting apparatus conforming to a large-diameter wafer is required to divide the large-diameter wafer into four wafer quarters. However, existing apparatuses conforming to a small-diameter wafer can be used as a grinding apparatus for grinding the back side of each wafer quarter and a dicing apparatus for dividing each wafer quarter into individual devices. Accordingly, it is unnecessary to construct a new system conforming to a large-diameter wafer, and existing equipment can be used to the maximum to thereby save equipment costs.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
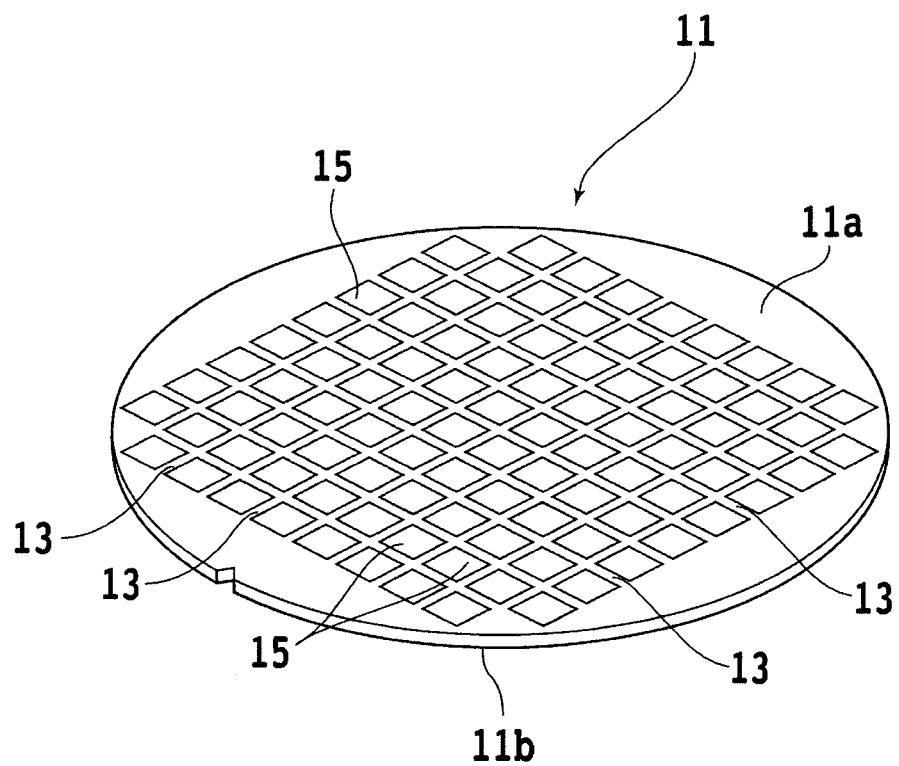
FIG. 1 is a perspective view of a semiconductor wafer (450-mm wafer) as viewed from the front side thereof.

A preferred embodiment of the present invention will now be described with reference to the drawings. FIG. 1 shows a semiconductor wafer 11 to be processed by the wafer processing method according to this preferred embodiment. The semiconductor wafer 11 shown in FIG. 1 is a silicon wafer having a thickness of 700 μm, for example. As shown in FIG. 1, the semiconductor wafer 11 has a front side 11a and a back side 11b. Further, a plurality of crossing division lines (streets) 13 are formed on the front side 11a of the semiconductor wafer 11, thereby partitioning a plurality of regions where a plurality of devices 15 are respectively formed. The wafer 11 has a diameter of 450 mm. There will now be described the wafer processing method according to this preferred embodiment for dividing the 450-mm wafer 11 as a large-diameter wafer into the individual devices 15 by using existing equipment to the maximum, with reference to FIGS. 2 to 10.

Figure 2:
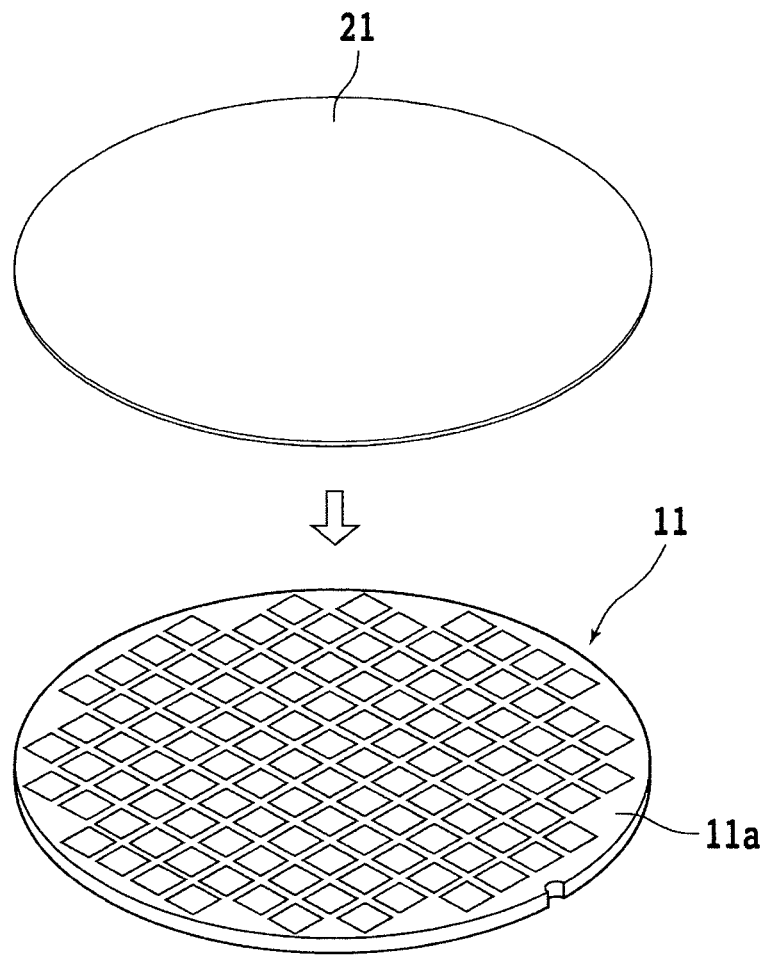
FIG. 2 is a perspective view showing a manner of attaching a protective tape to the front side of the wafer shown in FIG. 1.

As shown in FIG. 2, a protective member providing step is first performed in such a manner that a protective member is provided on the front side 11a of the wafer 11. More specifically, a circular protective tape 21 as the protective member is attached to the front side 11a of the wafer 11. In this preferred embodiment, the protective tape 21 is formed of a transparent resin. As a modification, a transparent glass plate as the protective member may be attached to the first side 11a of the wafer 11 in place of the transparent protective tape 21.

Figure 3:
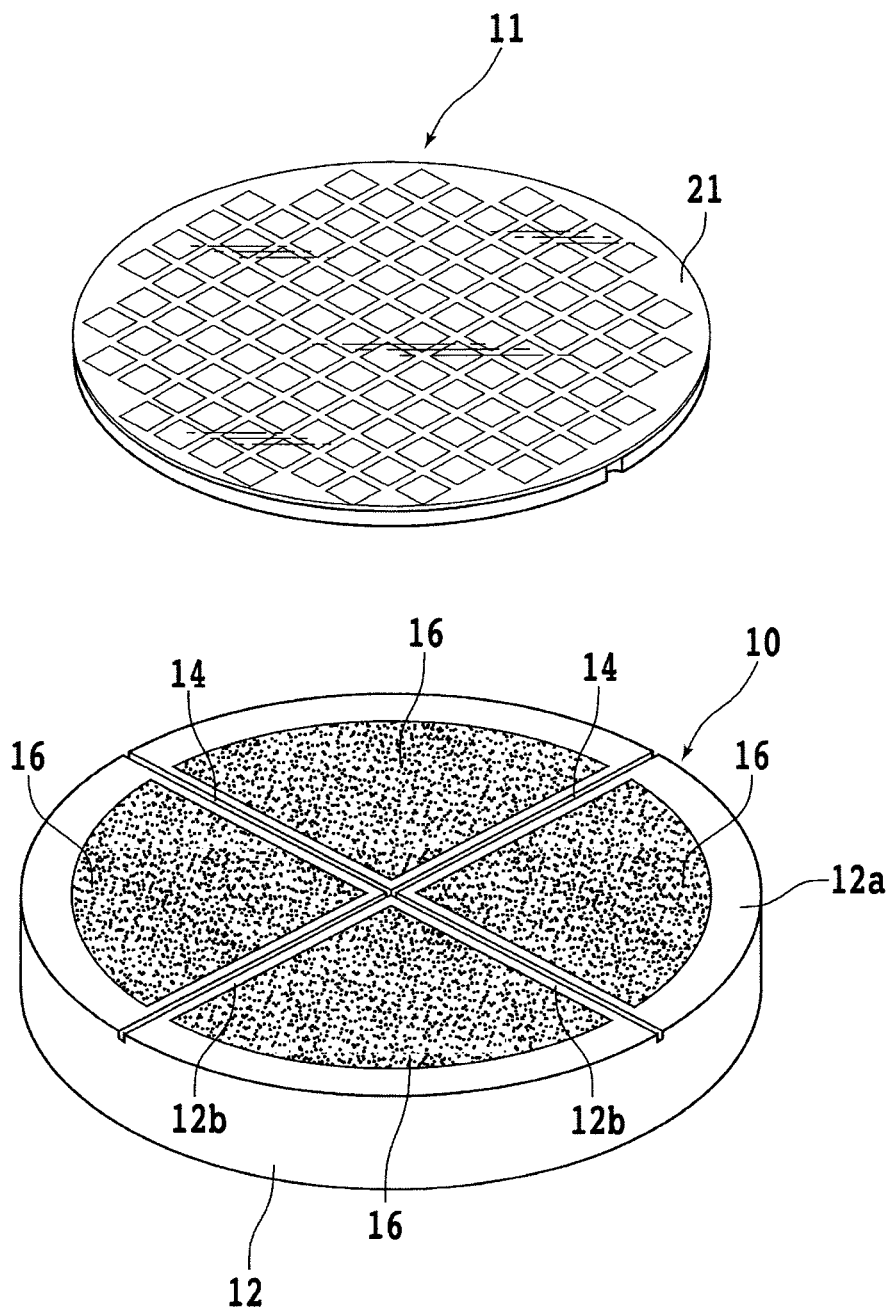
FIG. 3 is a perspective view showing a manner of holding the wafer with the protective tape shown in FIG. 2 on a chuck table conforming to a 450-mm wafer.

After performing the protective member providing step mentioned above, a wafer quarter generating step is performed by using a chuck table 10 shown in FIG. 3. This chuck table 10 is a chuck table in a dicing apparatus (cutting apparatus) conforming to the 450-mm wafer 11. That is, the chuck table 10 has a size (diameter) capable of holding the 450-mm wafer 11 under suction.

The chuck table 10 includes a frame 12 formed of stainless steel or the like. The frame 12 has an annular upper surface 12a and a cross-shaped upper surface 12b formed inside the annular upper surface 12a. The cross-shaped upper surface 12b is formed with two straight relief grooves 14 intersecting at right angles to each other at the center of the annular upper surface 12a. Each relief groove 14 has a predetermined depth. The chuck table 10 further includes four sectorial suction holding portions 16 surrounded by the annular upper surface 12a and the cross-shaped upper surface 12b of the frame 12. Each suction holding portion 16 is formed of porous ceramic or the like.

Figure 4:
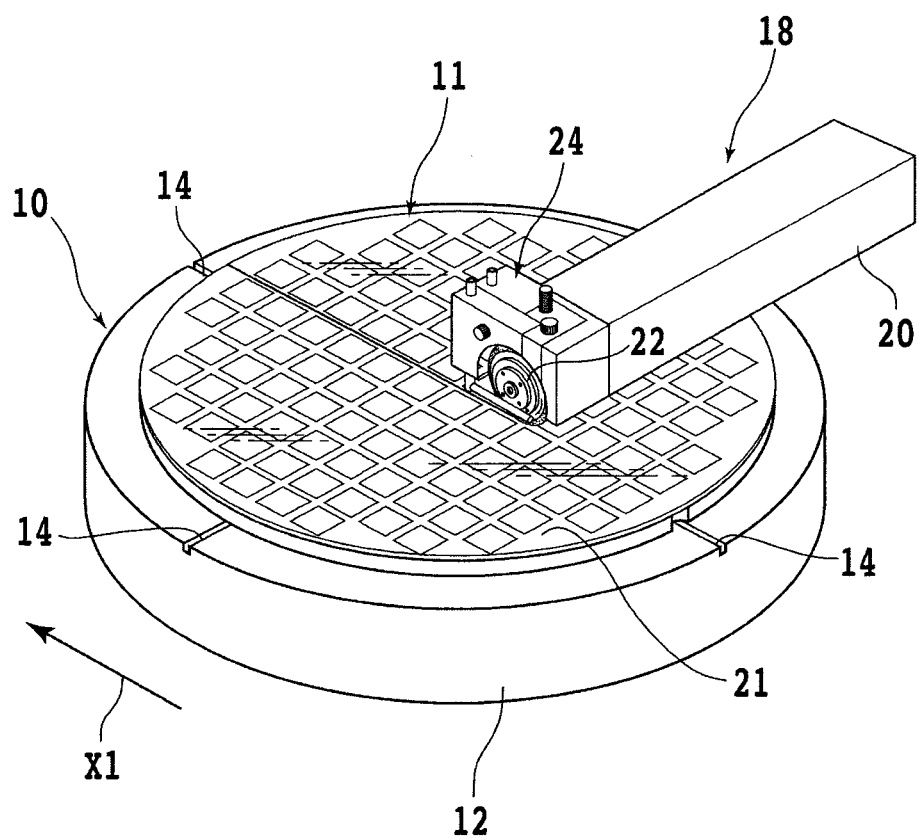
FIG. 4 is a perspective view showing a wafer quarter generating step using the chuck table shown in FIG. 3.
Figure 5:
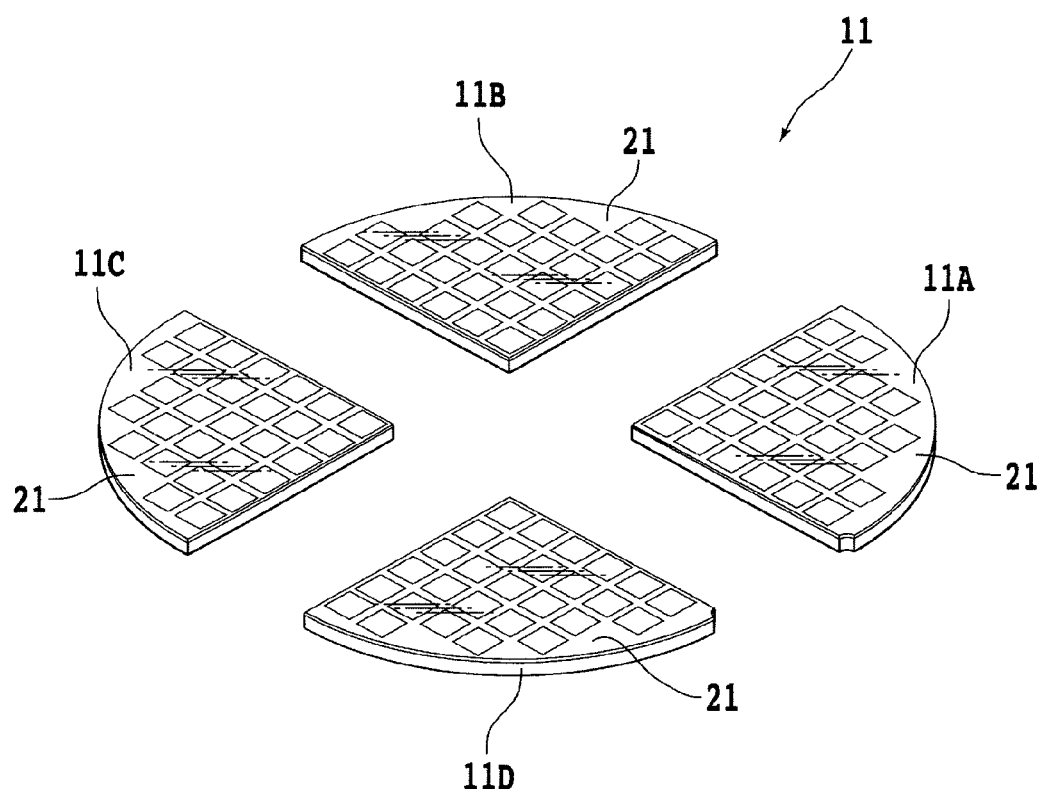
FIG. 5 is a perspective view of four wafer quarters obtained by the wafer quarter generating step shown in FIG. 4.

The wafer quarter generating step using the chuck table 10 is performed by cutting the wafer 11 along the division line 13 extending in a first direction through the center of the wafer 11 and along the division line 13 extending in a second direction perpendicular to the first direction through the center of the wafer 11, thereby generating four sectorial wafer quarters 11A, 11B, 11C, and 11D (see FIG. 5). In this wafer quarter generating step, the wafer 11 is held on the chuck table 10 under suction as shown in FIG. 4. The cutting apparatus having the chuck table 10 includes a cutting unit 18 shown in FIG. 4. The cutting unit 18 includes a spindle (not shown) rotatably supported and driven in a spindle housing 20, a cutting blade 22 mounted on the front end of the spindle, and a blade cover 24 for covering the upper half of the cutting blade 22.

The wafer quarter generating step is performed in the following manner. First, the cutting blade 22 is rotated at a high speed and lowered to cut into one end of the division line 13 extending in the first direction through the center of the wafer 11. Thereafter, the chuck table 10 is moved in the direction (feeding direction) shown by an arrow X1 in FIG. 4 to thereby completely cut the wafer 11 into two parts along this division line 13. In this complete cutting of the wafer 11, the outer circumference of the cutting blade 22 reaches a vertical position below the back side of the wafer 11. However, since the relief groove 14 is formed on the chuck table 10 so as to extend along this division line 13, there is no possibility that the cutting blade 22 may be damaged. Thereafter, the chuck table 10 is rotated 90° to similarly cut the wafer 11 along the division line 13 extending in the second direction through the center of the wafer 11, thereby obtaining the four sectorial wafer quarters 11A, 11B, 11C, and 11D shown in FIG. 5.

As described above, the protective tape 21 is formed of a transparent resin in this preferred embodiment. Accordingly, an alignment operation can be performed by using a normal imaging device (visible light) to make the alignment of the division line 13 to be cut and the cutting blade 22. In the case that the protective tape 21 is formed of an opaque resin, the front side 11a of the wafer 11 can be imaged through the protective tape 21 by using an infrared imaging device (infrared light) of an imaging unit provided in the cutting apparatus, thereby making the alignment of the division line 13 to be cut and the cutting blade 22.

Figure 6:
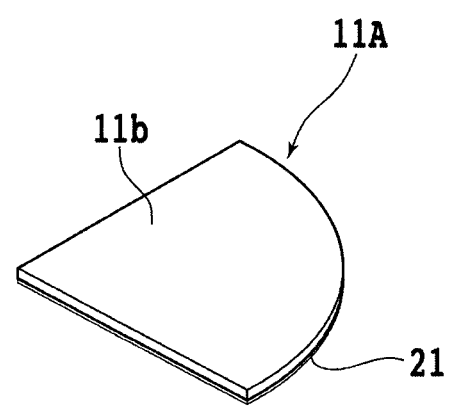
FIG. 6 is a perspective view showing a manner of holding each wafer quarter shown in FIG. 5 on a chuck table having a suction holding portion corresponding to each wafer quarter.
Figure 6:
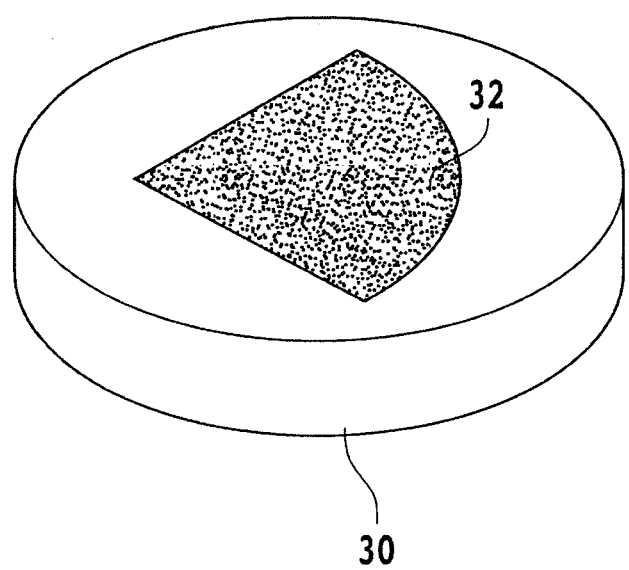

After performing the wafer quarter generating step mentioned above, a back grinding step is performed by using a chuck table 30 shown in FIG. 6. FIG. 6 is a perspective view showing a manner of holding the wafer quarter 11A with the protective tape 21 on the chuck table 30. The chuck table 30 has a sectorial suction holding portion 32 corresponding to the wafer quarter 11A. The chuck table 30 is mounted in a grinding apparatus conforming to a 300-mm wafer.

Figure 7:
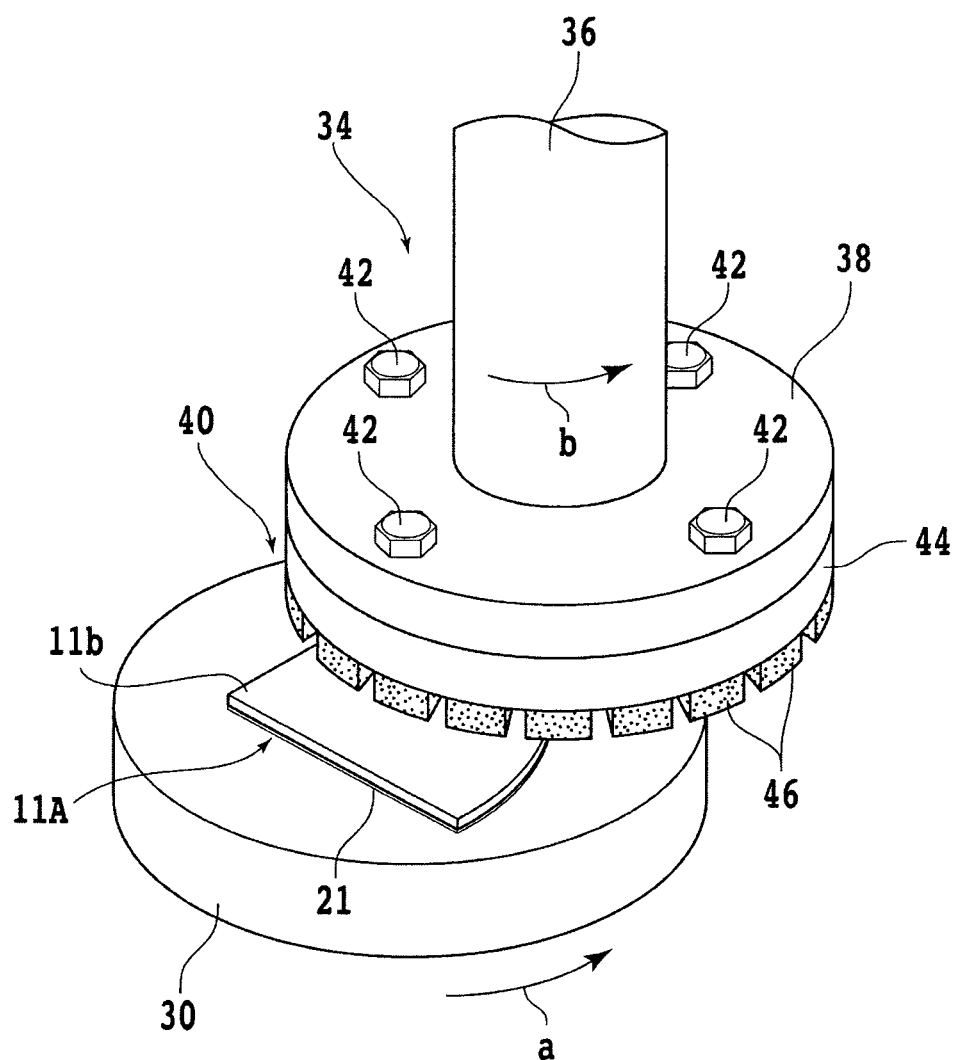
FIG. 7 is a perspective view showing a back grinding step using the chuck table shown in FIG. 6.

The back grinding step using the chuck table 30 is performed in the following manner. As shown in FIG. 7, the wafer quarter 11A is held through the protective tape 21 on the chuck table 30 in the condition where the back side 11b of the wafer quarter 11A is exposed. As shown in FIG. 7, the grinding apparatus includes a grinding unit 34. The grinding unit 34 includes a spindle 36 adapted to be rotationally driven, a wheel mount 38 fixed to the lower end of the spindle 36, and a grinding wheel 40 detachably mounted on the lower surface of the wheel mount 38 by a plurality of screws 42. The grinding wheel 40 is composed of an annular wheel base 44 and a plurality of abrasive members 46 fixed to the lower surface of the wheel base 44 along the outer circumference thereof so as to be arranged annularly at given intervals.

In performing the back grinding step of grinding the back side 11b of the wafer quarter 11A to thereby reduce the thickness of the wafer quarter 11A, the chuck table 30 holding the wafer quarter 11A through the protective tape 21 under suction is rotated at 300 rpm, for example, in the direction shown by an arrow a in FIG. 7 and the grinding wheel 40 is also rotated at 6000 rpm, for example, in the direction shown by an arrow b in FIG. 7. In this rotational condition, the abrasive members 46 of the grinding wheel 40 are brought into contact with the back side 11b of the wafer quarter 11A, and the grinding wheel 40 is fed downward at a predetermined feed speed (e.g., 1 µm/s), thereby grinding the back side 11b of the wafer quarter 11A to reduce the thickness of the wafer quarter 11A to a predetermined thickness. The back grinding step is similarly performed to all of the other wafer quarters 11B to 11D.

Figure 8:
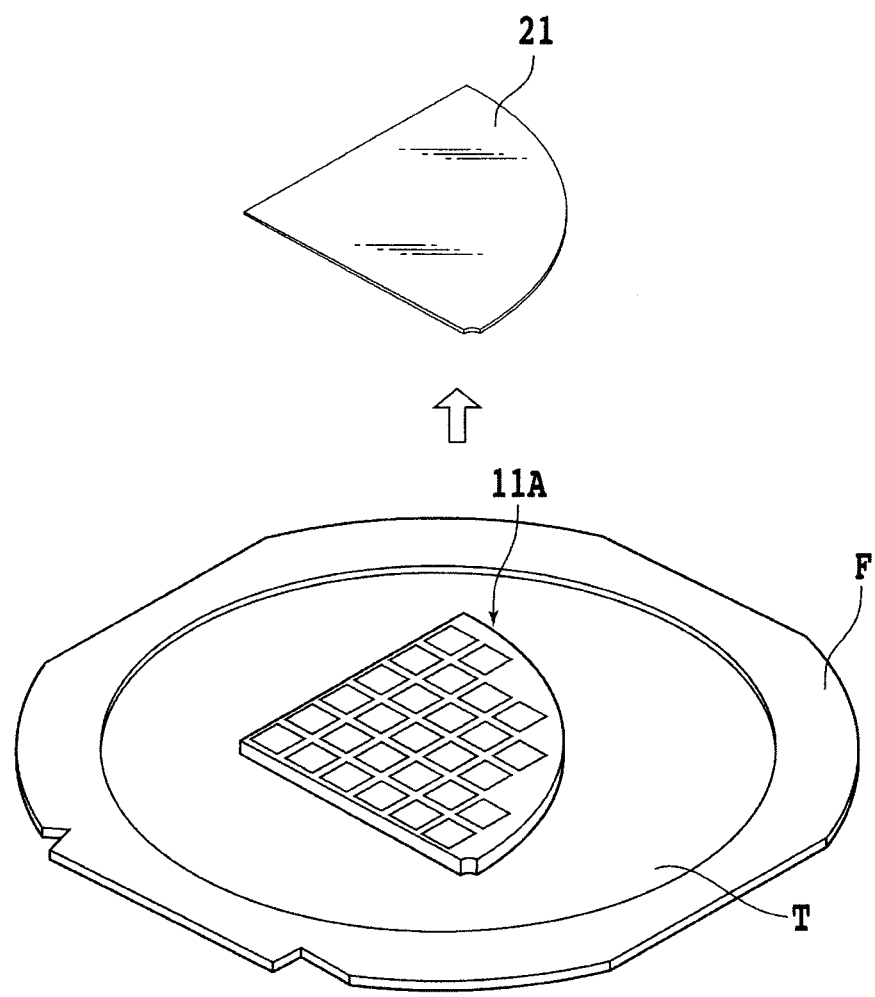
FIG. 8 is a perspective view showing a frame providing step.

After performing the back grinding step mentioned above, a frame providing step is performed in the following manner. As shown in FIG. 8, an annular frame F having an opening capable of accommodating the wafer quarter 11A is prepared and the wafer quarter 11A is placed in the opening of the annular frame F. In this condition, an adhesive tape T is attached to the annular frame F and the back side 11b of the wafer quarter 11A. Thereafter, the protective tape 21 is peeled from the front side 11a of the wafer quarter 11A to thereby support the wafer quarter 11A through the adhesive tape T to the annular frame F. The frame providing step is similarly performed to all of the other wafer quarters 11B to 11D.

Figure 9:
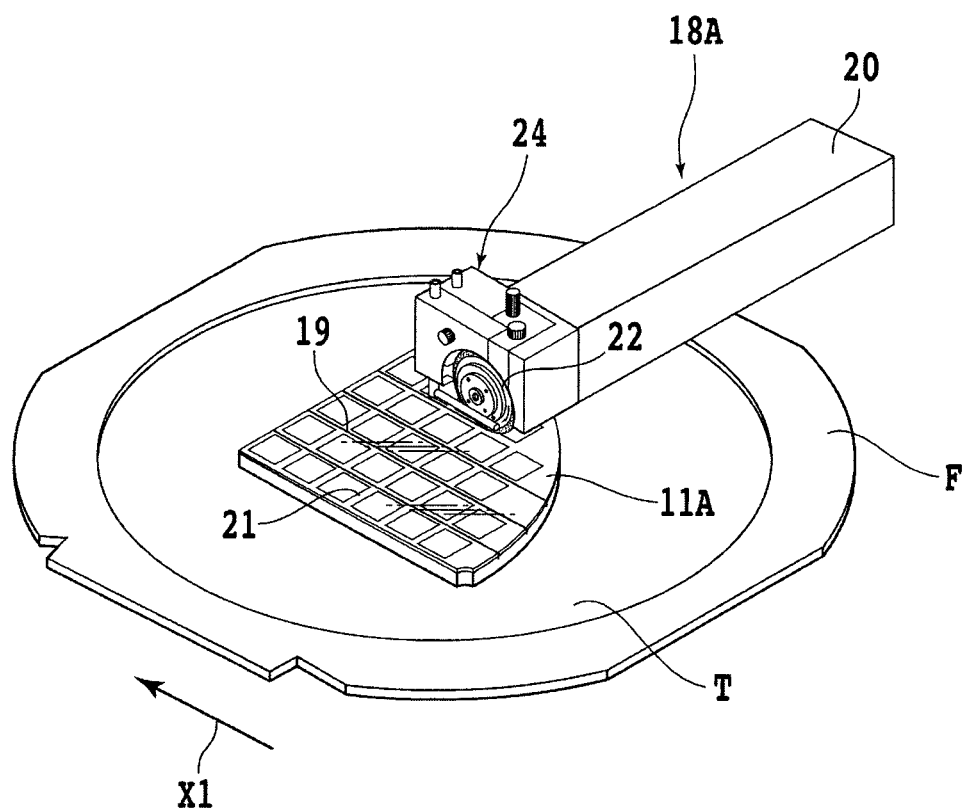
FIG. 9 is a perspective view showing a wafer quarter dividing step.

After performing the frame providing step mentioned above, a wafer quarter dividing step is performed to divide the wafer quarter 11A into the individual devices 15 by using a cutting unit 18A of a cutting apparatus conforming to a 300- mm wafer as shown in FIG. 9. In this wafer quarter dividing step, the wafer quarter 11A supported through the adhesive tape T to the annular frame F is held on a chuck table (not shown) under suction. Thereafter, the cutting blade 22 of the cutting unit 18A is rotated at a high speed and lowered to cut into the wafer quarter 11A so as to reach the adhesive tape T at one end of a predetermined one of the division lines 13 extending in the first direction. Thereafter, the chuck table (not shown) is moved in the direction (feeding direction) shown by an arrow X1 in FIG. 9 to thereby form a full-cut groove 19 along the predetermined division line 13 extending in the first direction.

Figure 10:
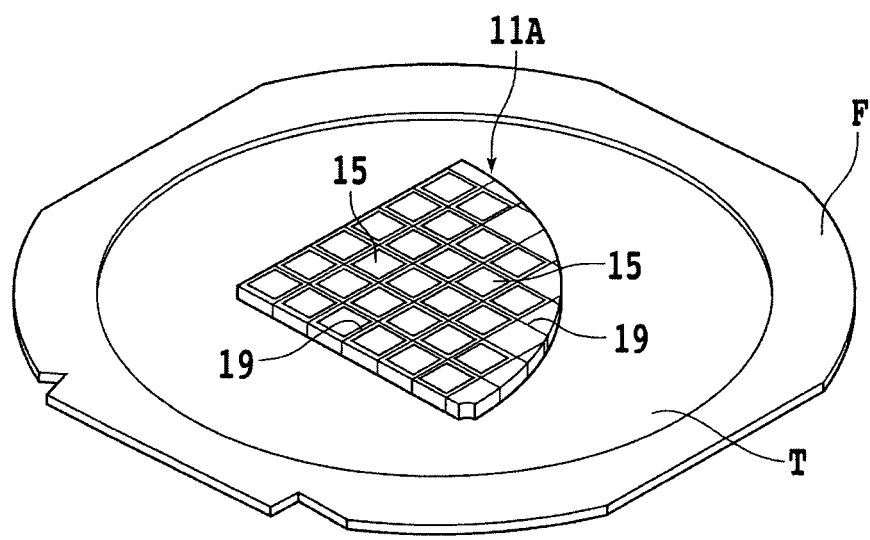
FIG. 10 is a perspective view of each wafer quarter divided into individual devices by the wafer quarter dividing step shown in FIG. 9.

This wafer quarter dividing step is similarly performed along all of the other division lines 13 extending in the first direction to thereby form a plurality of similar full-cut grooves 19. Thereafter, the chuck table is rotated 90° to similarly form the wafer quarter dividing step along all of the division lines 13 extending in the second direction, thereby forming a plurality of similar full-cut grooves 19. As a result, the wafer quarter 11A is divided into the individual devices 15 as shown in FIG. 10. The wafer quarter dividing step is similarly performed to all of the other wafer quarters 11B to 11D. Although not shown, a pickup step is next performed to pick up each device 15 from the adhesive tape T by using a pickup collet, for example.

According to the wafer processing method of the present invention, at least one cutting apparatus conforming to a large-diameter wafer such as a 450-mm wafer is required to divide the large-diameter wafer into four wafer quarters. However, existing apparatuses conforming to a small-diameter wafer such as a 300-mm wafer can be used as a grinding apparatus for grinding the back side of each wafer quarter and a dicing apparatus (cutting apparatus) for dividing each wafer quarter into individual devices. Accordingly, it is unnecessary to construct a new system conforming to a large-diameter wafer, and existing equipment can be used to the maximum to thereby save equipment costs.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer having a diameter of at least about 450 mm into a plurality of individual devices along a plurality of division lines extending in a first direction on a front side of said wafer and a plurality of division lines extending in a second direction perpendicular to said first direction on the front side of said wafer, said individual devices being respectively formed in a plurality of regions partitioned by said division lines extending in said first direction and said division lines extending in said second direction, said wafer processing method comprising:

a protective member providing step of providing a protective member on the front side of said wafer;

a first holding step of holding said wafer with said protective member provided on the front side of said wafer by a first chuck table having two straight relief grooves intersecting at right angles to each other at the center of an upper surface of said chuck table and four sectional suction holding portions partitioned by said relief grooves;

a wafer quarter generating step of cutting said wafer and the protective member along said division line extending in said first direction through the center of said wafer and along said division line extending in said second direction through the center of said wafer after performing said protective member providing step, thereby generating four sectorial wafer quarters;

a second holding step of holding said wafer quarter by a second chuck table having a sectorial suction holding portion corresponding to said wafer quarter, said second chuck table being mounted in a grinding apparatus configured for holding a wafer with a diameter no greater than 300 mm;

a back grinding step of grinding a back side of a single wafer quarter to reduce the thickness of said wafer quarter after performing said wafer quarter generating step;

a frame providing step of preparing an annular frame having an opening capable of accommodating said wafer quarter after performing said back grinding step, next placing said wafer quarter in said opening of said annular frame, next attaching an adhesive tape to said annular frame and a back side of said wafer quarter, and next peeling said protective member from the front side of said wafer quarter, thereby supporting said wafer quarter through said adhesive tape to said annular frame; and a wafer quarter dividing step of fully cutting said wafer quarter along all of said division lines extending in said first direction and along all of said division lines extending in said second direction after performing said frame providing step, thereby dividing said wafer quarter into said individual devices, whereby said at least about 450 mm wafer exceeds a wafer diameter size that can be held on said second chuck table configured for holding a wafer with a diameter no greater than 300 mm.

* * * * *